(12) United States Patent
Sao

(10) Patent No.: US 10,204,792 B2
(45) Date of Patent: Feb. 12, 2019

(54) PRODUCTION OF A THIN SUBSTRATE LAYER

(71) Applicant: AZUR SPACE Solar Power GmbH, Heilbronn (DE)

(72) Inventor: Cherubin Noumissing Sao, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 15/956,136

(22) Filed: Apr. 18, 2018

(65) Prior Publication Data

US 2018/0301343 A1  Oct. 18, 2018

(30) Foreign Application Priority Data

Apr. 18, 2017  (DE) .......................... 10 2017 003 698

(51) Int. Cl.
| | |
|---|---|
| *H01L 21/00* | (2006.01) |
| *H01L 21/304* | (2006.01) |
| *H01L 31/18* | (2006.01) |
| *H01L 31/0392* | (2006.01) |
| *B28D 5/00* | (2006.01) |

(52) U.S. Cl.
CPC .......... *H01L 21/304* (2013.01); *B28D 5/0011* (2013.01); *H01L 31/0392* (2013.01); *H01L 31/18* (2013.01); *H01L 31/1804* (2013.01); *H01L 31/1892* (2013.01)

(58) Field of Classification Search
CPC ... H01L 21/304; H01L 31/0392; H01L 31/18; H01L 31/1804; H01L 31/1892; H01L 31/1896
See application file for complete search history.

(56) References Cited

U.S. PATENT DOCUMENTS

| | | |
|---|---|---|
| 5,734,564 A | 3/1998 | Brkovic |
| 6,100,166 A | 8/2000 | Sakaguchi et al. |
| 7,875,531 B2 | 1/2011 | Dross et al. |
| 9,263,626 B1 * | 2/2016 | Cheng ................. H01L 31/1896 |
| 2007/0249140 A1 | 10/2007 | Dross et al. |
| 2009/0280635 A1 | 11/2009 | Mathew et al. |
| 2010/0310775 A1 | 12/2010 | Bedell et al. |
| 2010/0311250 A1 * | 12/2010 | Bedell ................. H01L 31/0725 438/759 |

(Continued)

*Primary Examiner* — Richard A Booth
(74) *Attorney, Agent, or Firm* — Muncy, Geissler, Olds & Lowe, P.C.

(57) ABSTRACT

A method for producing a thin substrate layer having a thickness of at most 100 µm by detaching a substrate layer from the ingot by producing a tensile stress induction on an ingot, and wherein the tensile stress induction is effected by a stressor layer structure integrally bonded to a first surface of the ingot. The stressor layer structure and the ingot have different thermal expansion coefficients, and the stressor layer structure is removed from the substrate layer after detachment of the substrate layer from the ingot. The stressor layer structure has at least one layer sequence with a first titanium-containing layer and a nickel-containing layer. The titanium-containing layer adjoins with a bottom side a first surface of the ingot and the nickel-containing layer adjoins with a bottom side a top side of the titanium-containing layer.

9 Claims, 1 Drawing Sheet

(56) References Cited

U.S. PATENT DOCUMENTS

| | | | | |
|---|---|---|---|---|
| 2012/0217622 A1* | 8/2012 | Bedell | ............... | H01L 21/78 |
| | | | | 257/632 |
| 2012/0285520 A1* | 11/2012 | Bedell | ............... | H01L 31/18 |
| | | | | 136/255 |
| 2016/0204304 A1* | 7/2016 | Gunawan | ............ | H01L 31/1896 |
| | | | | 136/256 |

\* cited by examiner

PRODUCTION OF A THIN SUBSTRATE LAYER

This nonprovisional application claims priority under 35 U.S.C. § 119(a) to German Patent Application No. 10 2017 003 698.5, which was filed in Germany on Apr. 18, 2017, and which is herein incorporated by reference.

BACKGROUND OF THE INVENTION

Field of the Invention

The present invention relates to a method for producing a thin substrate layer.

Description of the Background Art

Thin layers of a substrate, e.g., a semiconductor material, are produced inter alia by detaching the substrate layer from an ingot. This can save substrate costs.

As described in U.S. Pat. No. 5,374,564 A and U.S. Pat. No. 6,100,166 A, the detachment can be accomplished by forming a porous layer spaced from a surface of the ingot, by depositing a film on the surface of the ingot, and by detaching the film with an ingot part, located above the porous layer, from the ingot.

U.S. Pat. No. 7,875,531 B2 discloses a method for producing a thin substrate layer, wherein the substrate layer is detached from the ingot by specific stress induction in an ingot. The stress induction is achieved by applying a further layer to a surface of the ingot, wherein the thermal expansion coefficients of the ingot and of the further layer differ and the temperature of the ingot and further layer is changed. Further methods for the production of a thin substrate layer are known from US 2010/0310775 A1, US 2007/0249140 A1, and US 2009/0280635 A1.

SUMMARY OF THE INVENTION

It is therefore an object of the invention to provide a method that refines the prior art.

According to an exemplary embodiment of the invention, a method for producing a thin substrate layer having a thickness of at most 100 µm is provided by detaching the substrate layer from the ingot by producing a tensile stress induction on an ingot.

The tensile stress induction is effected by means of a stressor layer structure integrally bonded to a first surface of the ingot.

The stressor layer structure and the ingot have different thermal expansion coefficients.

The stressor layer structure is removed from the substrate layer after detachment of the substrate layer from the ingot.

The stressor layer structure has at least one first layer sequence with a titanium-containing layer and a nickel-containing layer.

The titanium-containing layer adjoins with a bottom side the first surface of the ingot, wherein the titanium-containing layer comprises at least 30% titanium, and wherein the nickel-containing layer adjoins with a bottom side a top side of the titanium-containing layer and the nickel-containing layer comprises at least 30% nickel.

It should be noted that the ingot and correspondingly the thin substrate layer to be produced typically includes a monocrystalline semiconductor material, e.g., GaN or Ge or GaAs. The detached thin layer can be referred to as a wafer and can serve as a so-called substrate for the production of electronic components. In this case, the components in the wafer and/or on the surface of the wafer are formed by means of semiconductor processes.

When the mass fraction is given as a percentage, this should be understood to mean the proportion of the particular element or compound relative to the total mass of the layer.

An especially high stress induction can be achieved by means of the stressor layer structure of the invention, in contrast to a stressor layer structure with a single layer, i.e., with a so-called monolayer structure.

Surprisingly, as the thickness of the single layer continues to increase, the stress value acting on the top side of the ingot decreases by a relaxation already taking place within the single layer.

It is possible to produce especially thin substrate layers in a range, for example, between 5 µm and 50 µm and in particular in a range between 10 µm and 25 µm reliably and reproducibly with the present method with a multilayer structure.

An advantage of the method of the invention with the new layer structure is that the material consumption for a wafer to be produced can be reduced by producing an especially thin substrate layer, which reduces production costs.

A further advantage of a reliable and simple production of thin substrate layers is that the use of problematic materials such as, for example, GaAs or Ge can be reduced.

At least one further metal layer and/or a metal oxide layer are disposed on the first layer sequence. In addition or alternatively, a further layer sequence is formed on the first layer sequence. It is understood that the further metal layer is not formed of nickel or has a nickel content above 20%.

A further titanium-containing layer can be formed as a further metal layer or as a metal oxide layer, wherein the second titanium-containing layer adjoins with a bottom side a top side of the nickel-containing layer and the further titanium-containing layer comprises at least 30% titanium. Preferably, the further metal layer is formed of titanium or of titanium oxide.

To increase the stress induction, the stressor layer structure has at least one further layer sequence. The nickel-containing layer can be uppermost layer of the further layer sequence.

Each titanium-containing layer can have a thickness of at most 1 µm. In an embodiment, each nickel-containing layer can have a thickness of 2 µm to 10 µm.

The stressor layer structure has a thickness of between 5 µm and 35 µm or a thickness of between 15 µm and 25 µm.

The stressor layer structure can have at least one further layer sequence and/or a final layer, wherein the final layer comprises predominantly nickel and forms a stressor layer structure layer that is farthest from the first surface of the ingot. The stress induction can be increased by the further layer sequence.

To detach the substrate layer, the temperature of the ingot and of the stressor layer structure can be changed and/or the detachment of the substrate layer can be initiated by via a mechanical triggering.

A titanium oxide layer can be formed between two layer sequences, in particular the first layer sequence and the overlying layers.

The titanium-containing layer can be formed of titanium and the nickel-containing layer of nickel.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
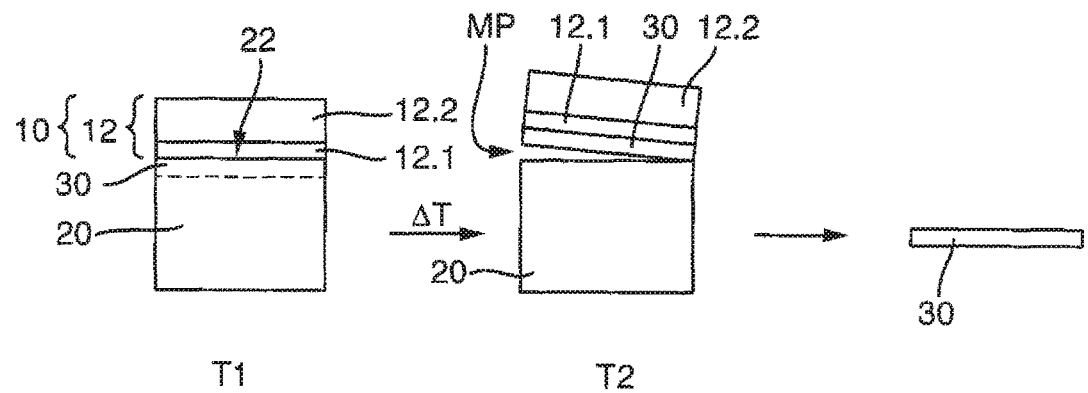
FIG. 1 is a schematic view of process steps for producing a thin substrate layer.

The illustration in FIG. 1 describes a method for producing a thin substrate layer 30 and a stressor layer structure 10.

Stressor layer structure 10 is applied to a first surface 22 of the ingot and integrally bonded to a first surface 22, wherein stressor layer 10 has only a first layer sequence 12 with a titanium layer 12.1 and a nickel layer 12.2 and in a first step is applied to an ingot 20.

During the application, ingot 20 and stressor layer structure 10 have a first temperature T1. In a second step, the temperature of ingot 20 and stressor layer structure 10 is changed by a temperature change $\Delta T$ to a second temperature T2. The second temperature T2 can be lower than the first temperature T1. Most preferably, the second temperature T2 is at a room temperature level.

Due to the tensile stress induction on the ingot which is produced by the different thermal expansion coefficients of ingot 20 and the stressor layer structure, a thin substrate layer 30 with stressor layer structure 10 detaches from ingot 20 either spontaneously or preferably by means of a mechanical pulse MP.

In a third process step, which is not shown in greater detail, stressor layer structure 10 is removed from thin substrate layer 30.

Figure 2:
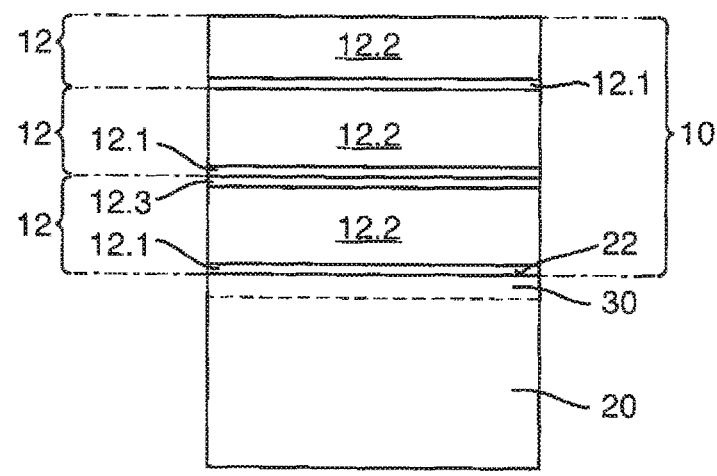
FIG. 2 is a schematic view of a first embodiment of the invention of an ingot with an applied stressor layer sequence.

A further embodiment of stressor layer structure 10 applied to ingot 20 is shown in the illustration in FIG. 2.

The illustrated stressor layer structure 10 has, in the following sequence, a first layer sequence 12, a further layer sequence 12, and a layer sequence 12 placed on the further layer sequence. The three layer sequences 12 each can be formed of a titanium layer 12.1 and a nickel layer 12.2.

First titanium layer 12.1 of first layer sequence 12 adjoins the first surface 22 of ingot 20 and titanium layer 12.1 of the further layer sequence 12 adjoins a further titanium layer 12.3. Nickel layer 12.2 of first layer sequence 12 adjoins with a bottom side, a top side of titanium layer 12.1 and adjoins with a top side, a bottom side of second titanium layer 12.3. Final layer 14 adjoins with a bottom side a top side of second titanium layer 12.3 of further layer sequence 12.

Titanium layers 12.1, 12.3 are formed essentially of or entirely of titanium. Nickel layers 12.2 are formed essentially or completely of nickel. The thicknesses of the individual layers of stressor layer structure 10 differ from one another, wherein titanium layers 12.1, 12.3 of layer sequence 12 each have a thickness of at most 1 µm, whereas nickel layers 12.2 each have a thickness of 2 to 10 µm.

The thin substrate layer 30 detaching due to the temperature change $\Delta T$ is indicated in the illustration of FIG. 2 by a dashed line.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing a thin substrate layer having a thickness of at most 100 µm, the method comprising:
    detaching the substrate layer from an ingot by producing a tensile stress induction on an ingot, the tensile stress induction being effected by a stressor layer structure that is integrally bonded to a first surface of the ingot, the stressor layer structure and the ingot having different thermal expansion coefficients,
    removing the stressor layer structure from the substrate layer after detachment of the substrate layer from the ingot,
    wherein the stressor layer structure has at least one layer sequence with a titanium-containing layer and a nickel-containing layer,
    wherein the titanium-containing layer adjoins with a bottom side, a first surface of the ingot and the titanium-containing layer has at least 30% titanium,
    wherein the nickel-containing layer adjoins with a bottom side, a top side of the titanium-containing layer and the nickel-containing layer has at least 30% nickel,
    wherein, to increase the stress induction, the stressor layer structure has at least one further layer sequence, and
    wherein the nickel-containing layer is the uppermost layer.

2. The method according to claim 1, wherein at least one further metal layer and/or a metal oxide layer are disposed on the first layer sequence and/or a further layer sequence is disposed on the first layer sequence.

3. The method according to claim 2, wherein a titanium-containing layer is formed as a further metal layer or as a metal oxide layer, wherein the titanium-containing layer adjoins with a bottom side, a top side of the nickel-containing layer, and wherein the titanium-containing layer has at least 30% titanium.

4. The method according to claim 1, wherein the stressor layer structure has a thickness of between 3 µm and 35 µm.

5. The method according to claim 1, wherein each titanium-containing layer has a thickness of at most 1 µm.

6. The method according to claim 1, wherein each nickel-containing layer has a thickness of 2 µm to 10 µm.

7. The method according to claim 1, wherein, to detach the substrate layer, the temperature of the ingot and of the stressor layer structure is changed and/or initiated via a mechanical triggering.

8. The method according to claim 2, wherein a titanium oxide layer is formed between two layer sequences.

9. The method according to claim 2, wherein the titanium-containing layer is formed essentially of titanium and the nickel-containing layer is formed essentially of nickel.

* * * * *